United States Patent
Otsuka et al.

(10) Patent No.: US 8,334,918 B2
(45) Date of Patent: Dec. 18, 2012

(54) SOLID-STATE IMAGING ELEMENT

(75) Inventors: Shinya Otsuka, Hamamatsu (JP);
Hisanori Suzuki, Hamamatsu (JP);
Yasuhito Yoneta, Hamamatsu (JP);
Masaharu Muramatsu, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 500 days.

(21) Appl. No.: 12/516,411

(22) PCT Filed: Nov. 28, 2007

(86) PCT No.: PCT/JP2007/072931
§ 371 (c)(1),
(2), (4) Date: Jun. 16, 2009

(87) PCT Pub. No.: WO2008/066067
PCT Pub. Date: Jun. 5, 2008

(65) Prior Publication Data
US 2010/0045841 A1    Feb. 25, 2010

(30) Foreign Application Priority Data
Nov. 28, 2006    (JP) ................. P2006-320554

(51) Int. Cl.
*H04N 3/14*    (2006.01)
*H04N 5/335*    (2011.01)

(52) U.S. Cl. ........................ 348/314; 348/299

(58) Field of Classification Search .......... 348/299, 348/311, 314, 316, 317, 324
See application file for complete search history.

(56) References Cited

U.S. PATENT DOCUMENTS

| | | | |
|---|---|---|---|
| 5,949,099 A | 9/1999 | Yasuda et al. | |
| 2002/0039144 A1* | 4/2002 | Yamada | 348/311 |
| 2002/0057356 A1 | 5/2002 | Tanabe | |
| 2004/0105023 A1* | 6/2004 | Okada | 348/311 |
| 2006/0077274 A1* | 4/2006 | Wako et al. | 348/311 |

FOREIGN PATENT DOCUMENTS

| | | |
|---|---|---|
| EP | 0059547 A1 | 9/1982 |
| EP | 1583150 A1 | 10/2005 |
| JP | 54-24530 | 2/1979 |
| JP | S60-039257 | 3/1985 |
| JP | S64-037177 | 2/1989 |
| JP | 6-283704 | 10/1994 |
| JP | 6283704 * | 10/1994 |
| JP | H7-130977 | 5/1995 |

(Continued)

*Primary Examiner* — Kelly L Jerabek
(74) *Attorney, Agent, or Firm* — Drinker Biddle & Reath LLP

(57) ABSTRACT

A solid-state image pickup device 1 includes: a plurality of photoelectric converters 2 which are aligned in a predetermined direction and have a potential made higher toward one side of a direction crossing the predetermined direction; a transferring section 6 which is provided on one side of the photoelectric converters 2 in the direction crossing the predetermined direction and transfers charges generated in the photoelectric converters 2 in the predetermined direction; an unnecessary charge discharging drain 7 which is provided adjacent to the photoelectric converter 2 along the direction crossing the predetermined direction and discharges unnecessary charges generated in the photoelectric converter 2 from the photoelectric converter 2; and an unnecessary charge discharging gate 8 which is provided between the photoelectric converter 2 and the unnecessary charge discharging drain 7 and selectively performs cutting-off and release of the flow of unnecessary charges from the photoelectric converter 2 to the unnecessary charge discharging drain 7.

7 Claims, 9 Drawing Sheets

FOREIGN PATENT DOCUMENTS

| | | | |
|---|---|---|---|
| JP | 2000-013687 | | 1/2000 |
| JP | 2000-58810 | | 2/2000 |
| JP | 2000058810 | * | 2/2000 |
| JP | 2002-135660 | | 5/2002 |
| JP | 2002-231926 | | 8/2002 |
| JP | 2005-268564 | | 9/2005 |

* cited by examiner

SOLID-STATE IMAGING ELEMENT

TECHNICAL FIELD

The present invention relates to a solid-state image pickup device, and more specifically, to a line sensor.

BACKGROUND ART

For the purpose of a higher charge readout speed in a solid-state image pickup device, a solid-state image pickup device having a potential gradient structure formed by dividing a diffusion layer of a photodiode into a plurality of regions and changing the impurity concentrations of the regions is known (for example, refer to Patent Document 1). Further, for the same purpose, a solid-state image pickup device in which a charge transfer electrode is provided as an upper layer of a photodiode, and a potential gradient is formed by applying a higher voltage to the charge readout side of this electrode, is known (for example, refer to Patent Document 2).

Further, for the purpose of control of a charge accumulation time in a photodiode, a solid-state image pickup device having a charge sweep-away gate and a charge sweep-away drain region for sweeping-away unnecessary charges which are formed along an alignment direction of a plurality of photodiodes is known (for example, refer to Patent Document 3).

Patent Document 1: Japanese Published Unexamined Patent Application No. 2002-231926
Patent Document 2: Japanese Published Unexamined Patent Application No. 2005-268564
Patent Document 3: Japanese Published Unexamined Patent Application No. 2002-135660

DISCLOSURE OF THE INVENTION

Problems to be Solved by the Invention

For a line sensor, realization of both of a higher charge readout speed and control of the charge accumulation time has been demanded. To satisfy this demand, for example, it is possible that the invention described in Patent Document 3 is applied to the invention described in Patent Document 1 or Patent Document 2 above, however, this has the following problem.

As in the invention described in Patent Document 1 or Patent Document 2 above, when the photodiode, etc., is provided with a potential gradient so that the potential becomes higher toward the readout gate, the charges generated in the photodiode always move toward the readout gate. Even if a line sensor having such a photodiode is provided with a charge sweep-away drain on the opposite side of the readout gate as in the case of the invention described in Patent Document 3 above, it is difficult to move the generated charges reversely on the potential gradient and sweep-away unnecessary charges.

Therefore, an object of the present invention is to provide a solid-state image pickup device which can control the charge accumulation time while realizing a higher charge readout speed.

Means for Solving the Problems

A solid-state image pickup device of the present invention includes: a plurality of photoelectric converters which are aligned in a predetermined direction and have a potential made higher toward one side of a direction crossing the predetermined direction; a transferring section which is provided on one side of the photoelectric converters in the direction crossing the predetermined direction and transfers charges generated in the photoelectric converters in the predetermined direction; an unnecessary charge discharging drain which is provided adjacent to the photoelectric converter along the direction crossing the predetermined direction and discharges unnecessary charges generated in the photoelectric converter from the photoelectric converter; and an unnecessary charge discharging gate which is provided between the photoelectric converter and the unnecessary charge discharging drain and selectively performs cutting-off and release of the flow of unnecessary charges from the photoelectric converter to the unnecessary charge discharging drain.

In this solid-state image pickup device, photoelectric converters are aligned in a predetermined direction, and the potential is made higher toward one side of the direction crossing the predetermined direction. The transferring section is provided on one side of the photoelectric converters in the direction crossing the predetermined direction, and transfers charges generated in the photoelectric converter in the predetermined direction. Therefore, charges generated in the photoelectric converter quickly move to the side of the higher potential and are read out from the transferring section to the outside. Further, an unnecessary charge discharging drain which discharges unnecessary charges from the photoelectric converter is provided adjacent to the photoelectric converter along the direction crossing the predetermined direction, and an unnecessary charge discharging gate which selectively performs cutting-off and release of the flow of unnecessary charges from the photoelectric converter to the unnecessary charge discharging drain is provided between the photoelectric converter and the unnecessary charge discharging drain. Therefore, when charges are accumulated, a potential barrier can be formed in the unnecessary charge discharging gate and necessary charges can be transferred to the transferring section. On the other hand, when charges are not accumulated, by removing the potential barrier of the unnecessary charge discharging gate, unnecessary charges can be discharged to the unnecessary charge discharging drain at one time in the direction crossing the predetermined direction of the photoelectric converter. Therefore, the charge accumulation time can be controlled while realizing a higher charge readout speed.

Further, preferably, the solid-state image pickup device of the present invention includes: a saturated charge discharging drain which is provided on the other side of the photoelectric converter in the direction crossing the predetermined direction and discharges saturated charges generated in the photoelectric converter from the photoelectric converter; and a saturated charge discharging gate which is provided between the photoelectric converter and the saturated charge discharging drain and selectively performs cutting-off and release of the flow of saturated charges from the photoelectric converter to the saturated charge discharging drain. According to this solid-state image pickup device, even if saturated charges are generated by overexposure or instantaneous incidence of light with a high intensity on the photoelectric converter, the saturated charges can be discharged by the saturated charge discharging drain, so that a blooming phenomenon can be effectively prevented.

Further, preferably, in the solid-state image pickup device of the present invention, the level of the lowest potential of the photoelectric converter and the level of the potential barrier of the unnecessary charge discharging gate are substantially equal to each other. According to this solid-state image pickup device, when saturated charges are generated, the saturated charges not only exceed the lowest potential of the photoelectric converter and are discharged to the saturated charge discharging drain, but also exceed the potential barrier of the unnecessary charge discharging gate and are discharged to the unnecessary charge discharging drain. Therefore, even if saturated charges are generated by overexposure or instantaneous incidence of light with a high intensity, the saturated charges can be effectively discharged, so that the blooming phenomenon can be more efficiently prevented.

Further, preferably, in the solid-state image pickup device of the present invention, the unnecessary charge discharging drain is provided every two regions of the regions between the photoelectric converters adjacent to each other. According to this solid-state image pickup device, the photoelectric converters adjacent to each other share the unnecessary charge discharging drain provided in the region between these, and a comparatively high aperture ratio can be obtained while the minimum region of the unnecessary charge discharging drain is secured.

Further, preferably, in the solid-state image pickup device of the present invention, among the regions between the photoelectric converters adjacent to each other, in regions which are not provided with the unnecessary charge discharging drains, isolators are provided. According to this solid-state image pickup device, charges generated in the photoelectric converter can be prevented from flowing out to other photoelectric converters.

Further, preferably, in the solid-state image pickup device of the present invention, one transferring section is provided for each predetermined number of photoelectric converters, so that the number of transferring sections as a whole is a plurality, a drain terminal to be electrically connected to the unnecessary charge discharging drain and a gate terminal to be electrically connected to the unnecessary charge discharging gate are provided for each transferring section. According to this solid-state image pickup device, the charge accumulation time, that is, the exposure time can be controlled for each transferring section (output port).

Further, the solid-state image pickup device of the present invention may include a saturated charge discharging drain which is provided on the other side of the photoelectric converter in the direction crossing the predetermined direction and discharges saturated charges generated in the photoelectric converter from the photoelectric converter, and a saturated charge discharger which is provided between the photoelectric converter and the saturated charge discharging drain and makes saturated charges flow from the photoelectric converter to the saturated charge discharging drain.

Effect of the Invention

The present invention can provide a solid-state image pickup device which can control the charge accumulation time while realizing a higher charge readout speed.

Figure 1:
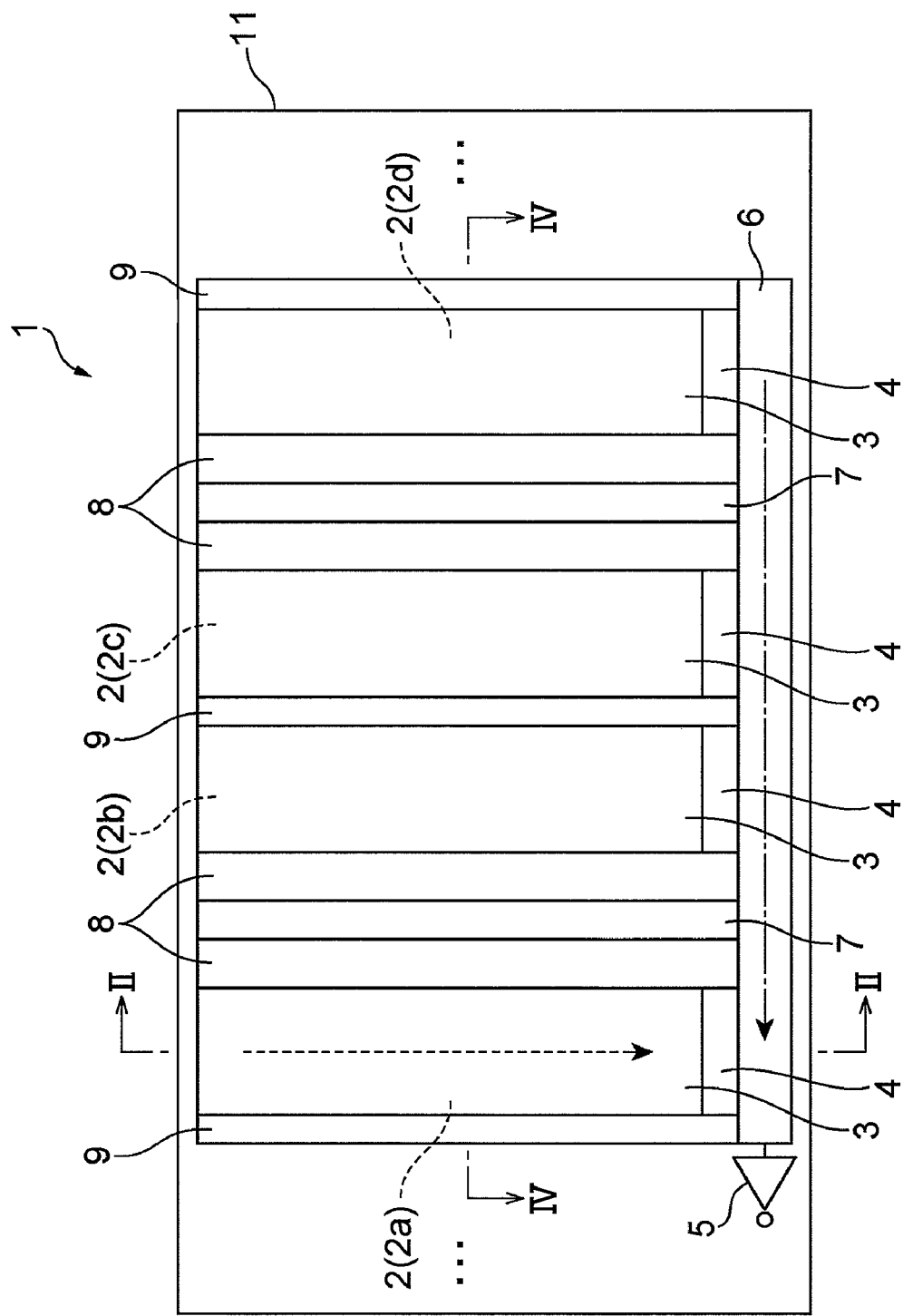
FIG. 1 is a schematic configuration view showing an embodiment of a solid-state image pickup device of the present invention.

DESCRIPTION OF SYMBOLS 1, 10: Solid-state image pickup device
2: Photoelectric converter
3: Resistive electrode
4: Readout gate
6: Transfer section
7: Unnecessary charge discharge drain
8: Unnecessary charge discharge gate
9: Isolator
23: Saturated charge discharge drain
24: Saturated charge discharge gate

BEST MODES FOR CARRYING OUT THE INVENTION

Knowledge of the present invention will be easily understood by considering the following detailed description with reference to the accompanying drawings shown by way of example only. Subsequently, embodiments of the present invention will be described with reference to the accompanying drawings. The same components are attached with the same reference numerals and letters and overlapping description will be omitted if possible.

An embodiment of a solid-state image pickup device of the present invention will be described with reference to FIG. 1 to FIG. 5. As shown in FIG. 1, the solid-state image pickup device 1 includes photoelectric converters 2, resistive electrodes 3, readout gates 4, transferring sections 6, unnecessary charge discharging drains 7, unnecessary charge discharging gates 8, and isolators 9.

The photoelectric converter 2 generates charges sensitively to incidence of energy beams (ultraviolet ray, infrared ray, visible light, and electron beam, etc.). The photoelectric converter 2 has a rectangular shape (here, 130 μm×18 μm) as viewed in the energy beam incidence direction. A plurality (here, 4096) of photoelectric converters 2 are aligned in a line along the width direction (shorter side direction of the rectangular shape) to constitute a line sensor. In the figure, only four photoelectric converters 2 are shown.

The resistive electrodes 3 are provided on the surface side of the photoelectric converters 2. At both end portions of the resistive electrode 3 in the direction crossing the alignment direction of the photoelectric converter, voltage applying sections (not shown) which apply predetermined voltages are provided. Further, for example, by applying a negative voltage to the upper voltage applying section in the figure and applying a positive voltage to the lower voltage applying section in the figure so as to obtain a predetermined potential difference in the photoelectric converter 2, a potential gradient is formed in the direction crossing the alignment direction so that the potential becomes higher downward in the figure.

As a result, charges generated in the photoelectric converter are transferred toward the side shown by the dotted-line arrow in the figure.

The readout gate 4 is provided for each photoelectric converter 2 on the charge transfer direction side of the photoelectric converter 2. The readout gate 4 blocks and accumulates the charges generated in and transferred by the photoelectric converter 2 by lowering the potential, and outputs the accumulated charges to the transferring section 6 by raising the potential.

The transferring section 6 is connected to the plurality of readout gates 4, and receives charges output from the readout gates 4 and transfers the charges in the horizontal direction (the arrow direction shown with the alternate long and short dashed line in the figure) and successively outputs the charges from the output section 5, and the charges are converted into voltages by an amplifier (not shown) included in the output section and output to the outside of the solid-state image pickup device 1 as voltages of the photoelectric converters 2, that is, voltages of the rows.

The unnecessary charge drains 7 are for discharging unnecessary charges generated in the photoelectric converters 2 from the photoelectric converters 2 to the outside. The unnecessary charge drains 7 are provided adjacent to the photoelectric converters 2 along the direction crossing the alignment direction of the photoelectric converters 2, that is, along the charge transfer direction of the photoelectric converters 2. Here, the unnecessary charge drains 7 are provided in the region between the photoelectric converters 2a and 2b and the region between the photoelectric converters 2c and 2d. In other words, the unnecessary charge discharging drain 7 is provided every two regions between the photoelectric converters 2 adjacent to each other. Therefore, one unnecessary charge discharging drain 7 discharges unnecessary charges of the two adjacent photoelectric converters 2a and 2b or photoelectric converters 2c and 2d.

The unnecessary charge discharging gates 8 are provided between the photoelectric converters 2 and the unnecessary charge discharging drain 7. The unnecessary charge discharging gates 8 function as shutters which selectively perform cutting-off and release of the flow of unnecessary charges from the photoelectric converters 2 to the unnecessary charge discharging drain 7. Therefore, when charges are accumulated, the unnecessary charge discharging gates 8 are closed, and when charges are not accumulated, the unnecessary charge discharging gates 8 are opened and discharge unnecessary charges to the unnecessary charge discharging drain 7. Here, the unnecessary charge discharging gates 8 are provided on both adjacent sides of one unnecessary charge discharging drain 7.

The isolators 9 isolate the photoelectric converters 2 from each other so as to prevent mixing of charges generated in these photoelectric converters. The isolator 9 is a region in which the unnecessary charge discharging drain 7 is not provided, and is provided in the region between the photoelectric converters 2 adjacent to each other. Here, the isolators 2 are provided between the photoelectric converters 2b and 2c and at the side end portions of the photoelectric converters 2a and 2d.

In the solid-state image pickup device 1, a transferring section 6 is provided for each photoelectric converters 2 of 32 pixels, and one output section 5 (port) is provided for each transferring section 6. In other words, a so-called multiport device including output sections 5 of 4096 pixels/32 pixels=128 ports is composed.

Figure 9:
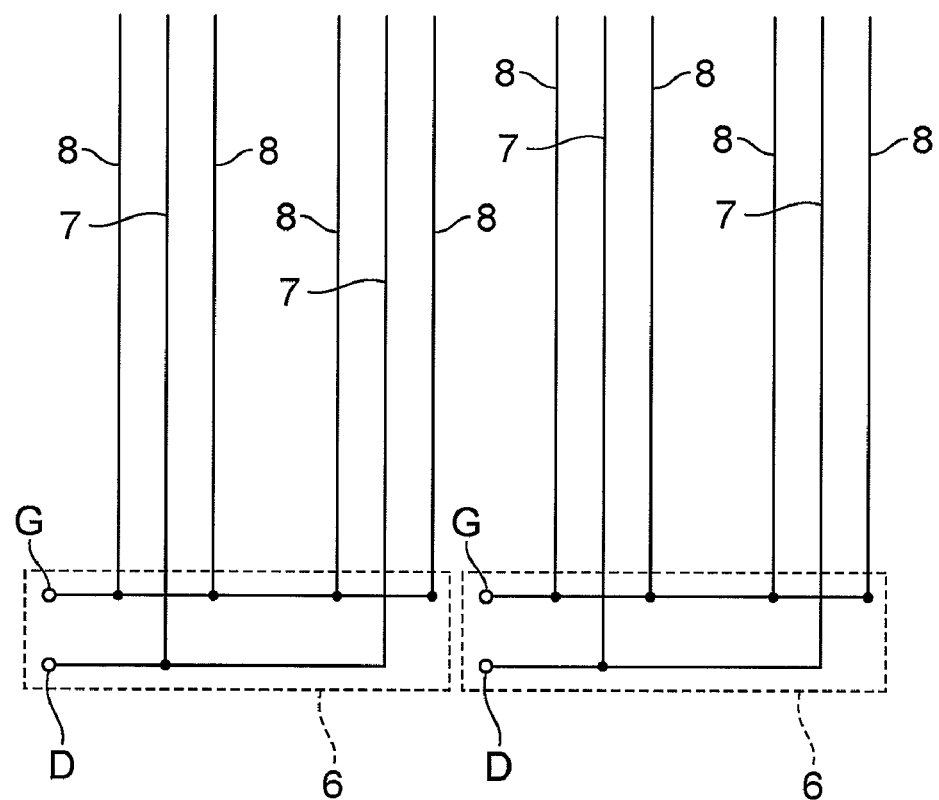
FIG. 9 is a view showing connections of drain terminals D and gate terminals G.

FIG. 9 is a view showing connections of drain terminals D and gate terminals G. As shown in FIG. 9, for each port, a drain terminal D to be electrically connected to the unnecessary charge discharging drains 7 and a gate terminal G to be electrically connected to the unnecessary charge discharging gates 8 are provided. Accordingly, the charge accumulation time can be controlled for each port independently.

As shown in FIG. 2 to FIG. 5, the photoelectric converters 2, the resistive electrodes 3, the readout gates 4, the transferring sections (not shown), the unnecessary charge discharging drains 7, the unnecessary charge discharging gates 8, and the isolators 9 are formed on the semiconductor substrate 11. The semiconductor substrate 11 includes a p-type Si substrate 12 whose conductivity type is p-type and which becomes a base of the semiconductor substrate 11, and n-type semiconductor layers 13, $n^+$ type semiconductor layers 14, p-type semiconductor layers 16, and $p^+$ type semiconductor layers 17 formed on the surface side of the p-type Si substrate 12.

Figure 2:
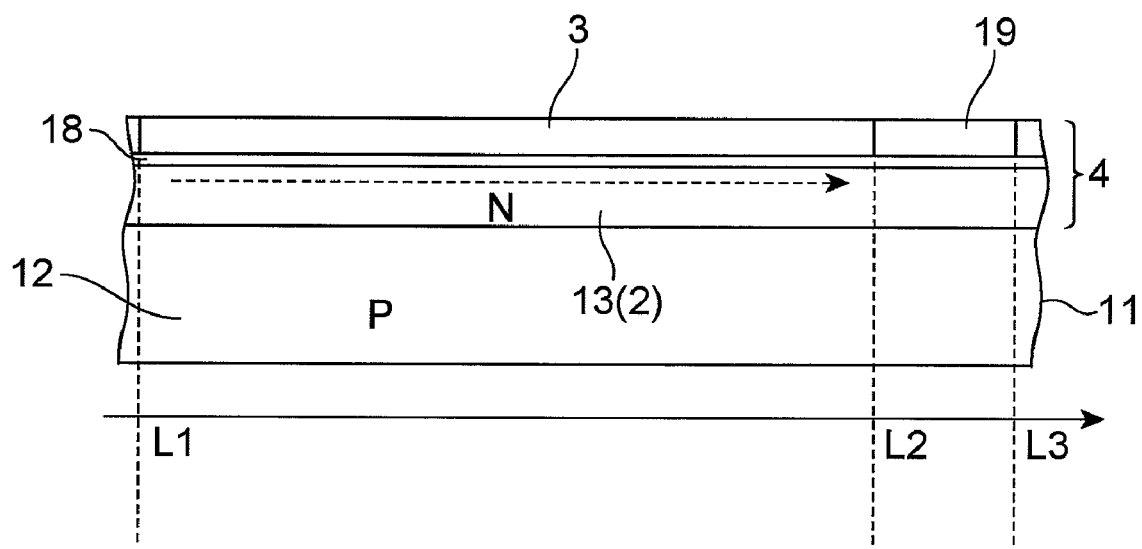
FIG. 2 is a sectional view along the II-II line of the solid-state image pickup device of FIG. 1.

As shown in FIG. 2, the p-type Si substrate 12 and the n-type semiconductor layer 13 form p-n junction, and the n-type semiconductor layer 13 constitutes a photoelectric converter 2 which generates charges in response to incidence of energy beams. On the surface of the semiconductor substrate 11, resistive electrodes 3 are provided via an insulating layer 18. The resistive electrodes 3 and the insulating layer 18 are made of materials which transmit energy beams, and here, the resistive electrodes 3 are formed of polysilicon films, and the insulating layer 18 is formed of a silicon oxide film.

On the surface of the charge transfer direction (in the figure, the dotted line arrow direction) side of the photoelectric converter 2 of the semiconductor substrate 11, readout gate electrodes 19 and a transfer electrode group (not shown) are provided via the insulating layer 18. The readout gate electrode 19 is provided adjacent to the most downstream side as viewed in the charge transfer direction of the resistive electrode 3 so that the longitudinal direction of the readout gate electrode 19 is in the alignment direction of the photoelectric converters 2. The resistive electrode 3 and the readout gate electrode 19 are not in electrical contact with each other. Into the readout gate electrode 19, a clock signal whose voltage level is at the H level or L level is input via the readout gate terminal (not shown). The readout gate electrode 19 and the n-type semiconductor layer 13 under the readout gate electrode 19 constitute a readout gate 4.

The transfer electrode group is lined up adjacent to the readout gate electrode 19 along the alignment direction of the photoelectric converters 2. The transfer electrode group and an n-type semiconductor layer (not shown) under the transfer electrode group, etc., constitute a transferring section.

Figure 3:
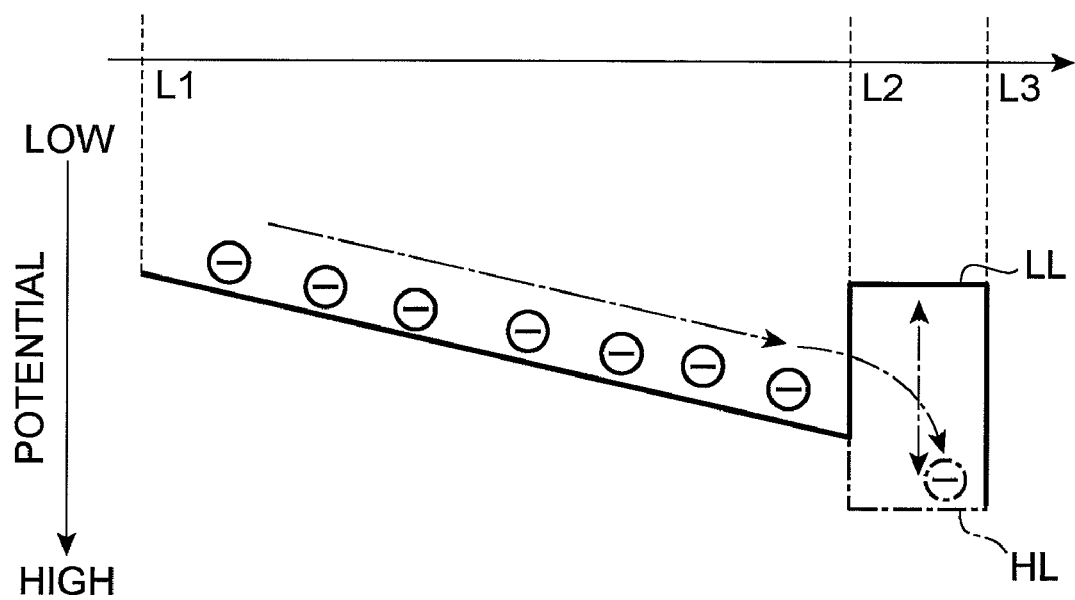
FIG. 3 is a diagram showing the level of the potential in the cross-section structure of the solid-state image pickup device of FIG. 2.

In the potential structure in the charge transfer direction of the photoelectric converter 2, as shown in FIG. 3, for example, by applying voltages of −5V to one end of the resistive electrode 3 (the end portion opposite to the charge transfer direction side) and +5V to the other end (the end portion on the charge transfer direction side), a potential distribution is generated on the resistive electrode 3, and a gradient is formed so that the potential becomes higher from one end to the other end.

In FIG. 3, potentials at the positions L1, L2, and L3 corresponding to the respective positions L1, L2, and L3 of FIG. 2 are shown. Between the positions L1 and L2, the potential rises toward the position L2. The potential between the positions L2 and L3 can selectively have the H level (HL) and the L level (LL) according to the voltage applied to the readout gate electrode 19.

Charges move along the gradient between the positions L1 and L2. According to the voltage level applied to the readout gate electrode 19, the level of the potential of the readout gate 4 fluctuates. When a voltage at the H level (for example, +8V)

is applied, the potential of the readout gate 4 becomes higher than the potential of the photoelectric converter 2, and charges generated in the photoelectric converter 2 flow into the readout gate 4. On the other hand, when a voltage at the L level (for example, −8V) is applied, the potential of the readout gate 4 becomes lower than the potential of the photoelectric converter 2, and a potential barrier is formed, and charges are accumulated in the photoelectric converter 2.

The method for forming the potential gradient in the photoelectric converter 2 is not limited to the method in which the resistive electrode 3 is provided on the surface side of the photoelectric converter 2 and a voltage is applied thereto so as to obtain a predetermined potential difference. It is also possible that the diffusion layer of the photoelectric converter 2 is divided into a plurality of regions and the impurity concentrations of the respective regions are made different. For example, the n-type semiconductor layer is divided into four regions, and the n-type impurity concentrations of the respective regions are set so as to rise in order in one direction. The level of the potential of the photoelectric converter 2 depends on the n-type impurity concentration, so that in the photoelectric converter 2, a potential gradient is formed so that the potential rises in a phased manner as the impurity concentration rises.

Figure 4:
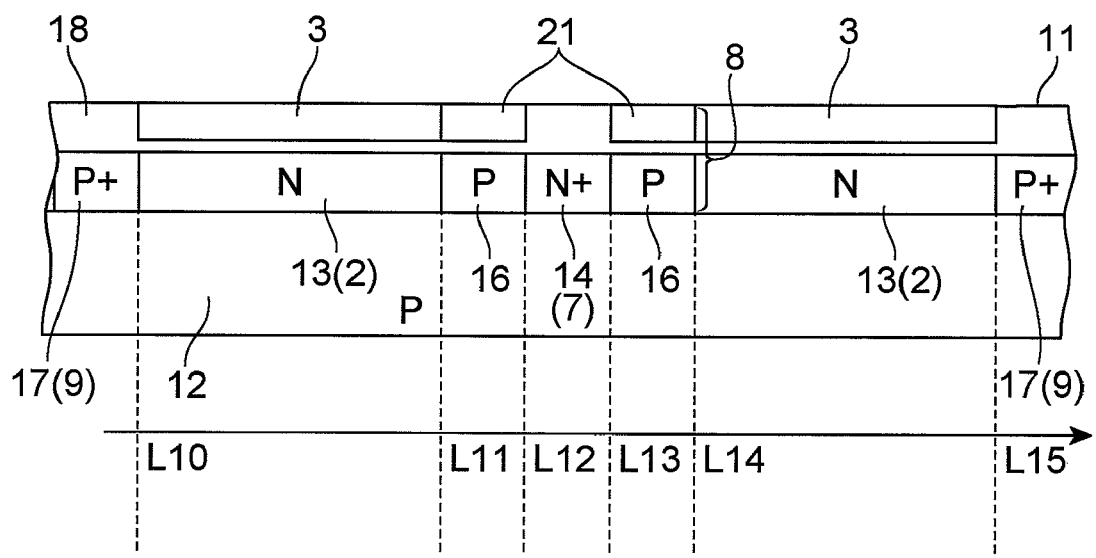
FIG. 4 is a sectional view along the IV-IV line of the solid-state image pickup device of FIG. 1.

As shown in FIG. 4, in the alignment direction of the photoelectric converters 2, in the diffusion layer of the semiconductor substrate 11, an n-type semiconductor layer 13, a p-type semiconductor layer 16, an $n^+$ type semiconductor layer 14, a p-type semiconductor layer 16, an n-type semiconductor layer 13, and a $p^+$ type semiconductor layer 17 are provided repeatedly in this order. The n-type semiconductor layer 13 constitutes a photoelectric converter 2 which generates charges in response to incidence of energy beams as described above. The p-type semiconductor layer 16 functions as the unnecessary charge discharging gate 8, and the $n^+$ type semiconductor layer functions as the unnecessary charge discharging drain 7. The $p^+$ type semiconductor layer 17 functions as the isolator 9 which isolates the photoelectric converters 2 from each other.

On the surface of the semiconductor substrate 11, unnecessary charge discharging gate electrodes 21 are provided via the insulating layer 18. The unnecessary charge discharging gate electrode 21 and the resistive electrode 3 adjacent to this unnecessary charge discharging gate electrode 21 are not in electrical contact with each other. The unnecessary charge discharging gate electrode 21 and the p-type semiconductor layer 16 under the unnecessary charge discharging gate electrode 21 constitute the unnecessary charge discharging gate 8. Into the unnecessary charge discharging gate electrode 21, a clock signal whose voltage level is at the H level or L level is input via the unnecessary charge discharging gate terminal (not shown).

Figure 5:
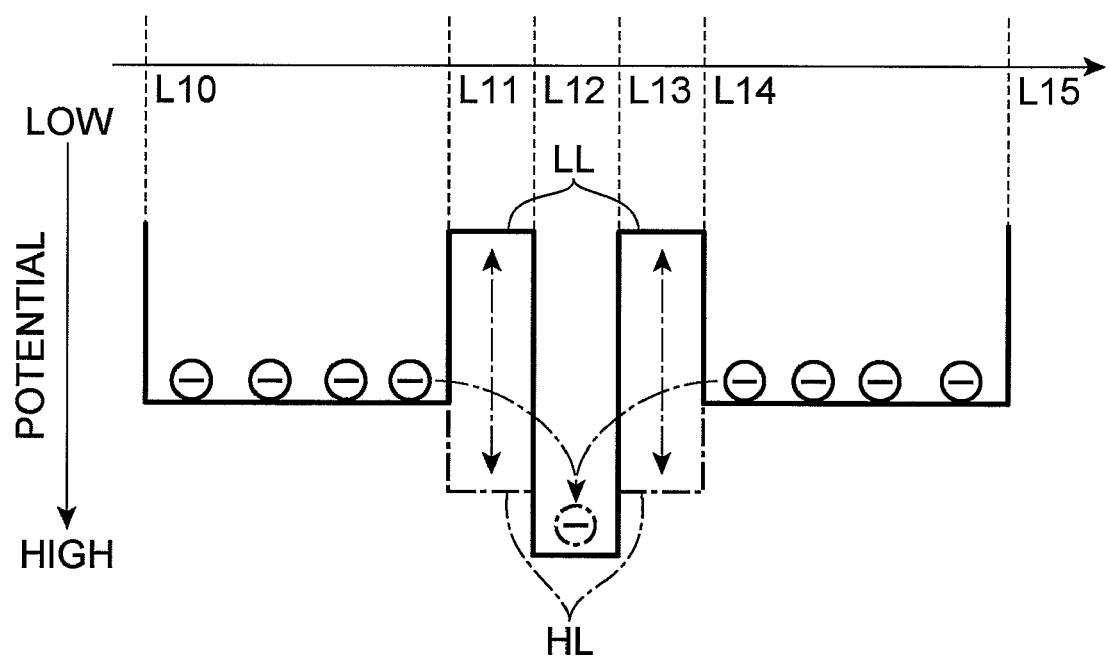
FIG. 5 is a diagram showing the level of the potential in the cross-section structure of the solid-state image pickup device of FIG. 4.

In the potential structure in the alignment direction of the photoelectric converters 2, as shown in FIG. 5, the level of the potential of the unnecessary charge discharging gate 8 fluctuates according to the voltage level applied to the unnecessary charge discharging gate electrode 21.

In FIG. 5, the potentials at the positions L10 to L15 corresponding to the respective positions L10 to L15 of FIG. 4 are shown. The potentials at the positions L11 to L12 and L13 to L14 can selectively have the H level (HL) and the L level (LL) according to the voltages applied to the unnecessary charge discharging gate electrodes 21.

When a voltage at the H level (for example, +8V) is applied to the unnecessary charge discharging gate electrode 21, the potential becomes higher than the potential of the photoelectric converter 2, and charges generated in the photoelectric converter 2 flow into the unnecessary charge discharging drain 7 with the highest potential. On the other hand, when a voltage at the L level (for example, −8V) is applied to the unnecessary charge discharging gate electrode 21, the potential becomes lower than the potential of the photoelectric converter 2, a potential barrier is formed between the photoelectric converter 2 and the drain 7, and charges are accumulated in the photoelectric converter 2. The potentials of the isolators 9 are set to be lowest to prevent charges from flowing into other pixels.

As described above, in the solid-state image pickup device 1, photoelectric converters 2 are aligned in a predetermined direction, and the potential is made higher toward one side of a direction crossing the predetermined direction. Further, a transferring section 6 is provided on one side of the photoelectric converters 2 in the direction crossing the predetermined direction, and transfers charges generated in the photoelectric converters 2 in the predetermined direction. Therefore, charges generated in the photoelectric converters 2 are quickly moved to the transferring section 6 along the potential gradient and read out to the outside from the transferring section 6. Further, unnecessary charge discharging drains 7 which discharge unnecessary charges from the photoelectric converters 2 are provided adjacent to the photoelectric converters 2 along the direction crossing the predetermined direction, and an unnecessary charge discharging gate 8 which selectively performs cutting-off and release of the flow of unnecessary charges from the photoelectric converter 2 to the unnecessary charge discharging drain 7 is provided between the photoelectric converter 2 and the unnecessary charge discharging drain 7. Therefore, during charge accumulation, a potential barrier of the unnecessary charge discharging gate 8 is formed and charges can be transferred to the transferring section 6. On the other hand, when charges are not accumulated, by removing the potential barrier of the unnecessary charge discharging gate 8, accumulated charges can be discharged at one time to the unnecessary charge discharging drain 7 in the direction crossing the predetermined direction of the photoelectric converter 2. Therefore, the charge accumulation time can be controlled while realizing a higher charge readout speed.

In the solid-state image pickup device 1 of the present invention, the unnecessary charge discharging drain 7 is provided every two regions between the photoelectric converters 2 adjacent to each other. Therefore, while the minimum region of the unnecessary charge discharging drain 7 is secured, a comparatively high aperture ratio can be obtained.

In the solid-state image pickup device 1 of the present invention, among the regions between the photoelectric converters 2 adjacent to each other, in the regions which are not provided with the unnecessary charge discharging drains 7, isolators 9 are provided. Therefore, charges generated in the photoelectric converter 2 can be prevented from flowing out to other photoelectric converters 2.

Further, in the solid-state image pickup device 1 of the present invention, one transferring section 6 is provided for each predetermined number of photoelectric converters 2, so that the number of transferring sections 6 as a whole is a plurality, a drain terminal D to be electrically connected to the unnecessary charge discharging drain 7 and a gate terminal G to be electrically connected to the unnecessary charge discharging gate 8 are provided for each plurality of transferring sections 6 (see FIG. 9). Therefore, for each transferring section 6 (output port), the charge accumulation time, that is, the exposure time can be controlled.

Figure 6:
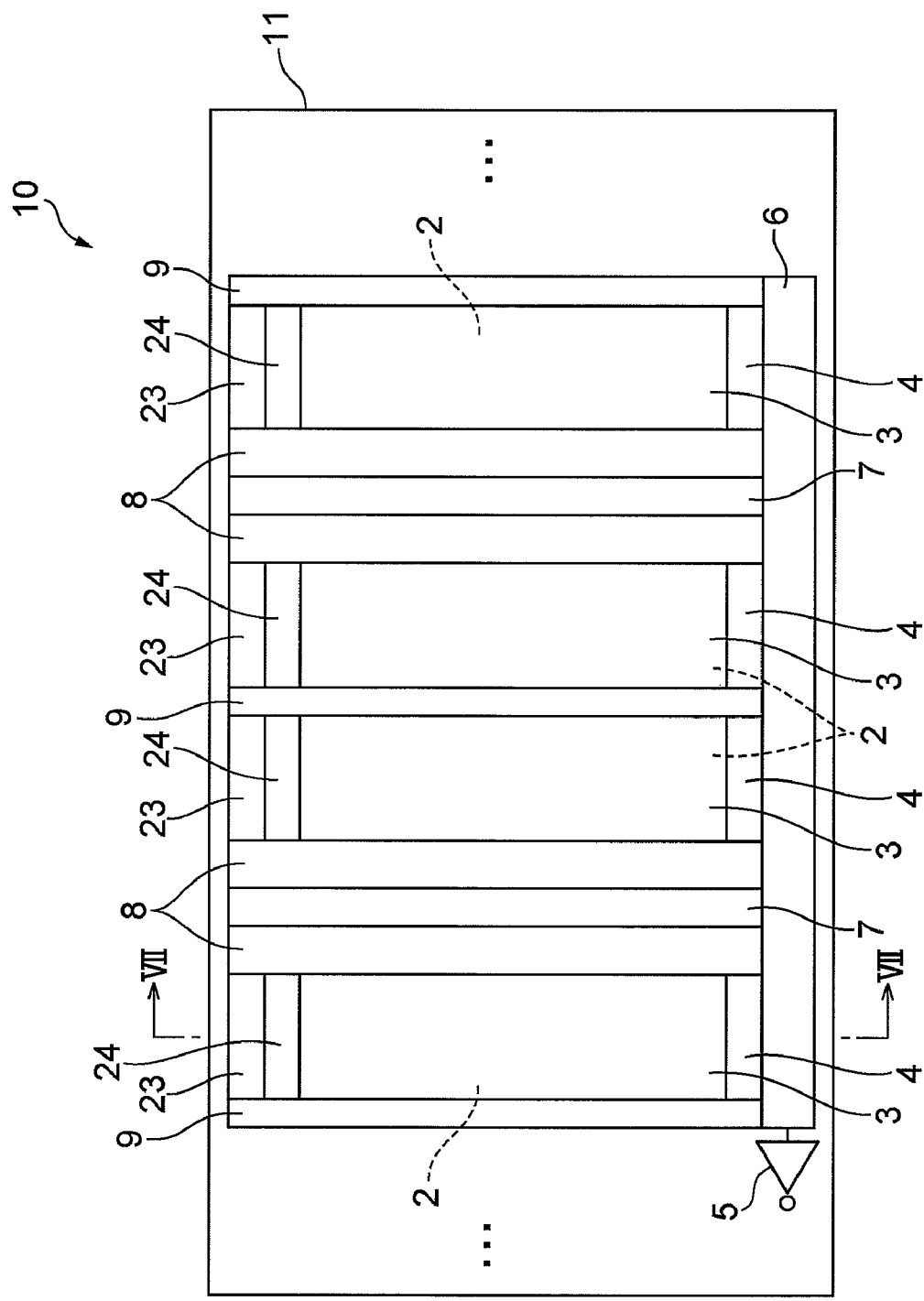
FIG. 6 is a schematic configuration view showing another embodiment of a solid-state image pickup device of the present invention.

Subsequently, another embodiment of a solid-state image pickup device of the present invention will be described with reference to FIG. 6, FIG. 7, and FIG. 8. As shown in FIG. 6, the solid-state image pickup device 10 includes photoelectric converters 2, resistive electrodes 3, readout gates 4, transferring sections 6, unnecessary charge discharging drains 7, unnecessary charge discharging gates 8, isolators 9, saturated charge discharging drains 23, and saturated charge discharging gates 24. The present embodiment provides a solid-state image pickup device obtained by providing means for discharging saturated charges (saturated charge discharging drains 23 and saturated charge discharging gates 24) in the solid-state image pickup device 1 of the embodiment described above.

The saturated charge discharging drain 23 is provided on the opposite side of the side of the readout gate 4 in the charge transfer direction of the photoelectric converter 2, and discharges saturated charges generated in the photoelectric converter 2 to the outside.

The saturated charge discharging gate 24 is provided between the photoelectric converter 2 and the saturated charge discharging drain 23. The saturated charge discharging gate 24 has a function as a shutter which selectively performs cutting-off and release of the flow of saturated charges from the photoelectric converter 2 to the saturated charge discharging drain 23, however, the saturated charge discharging gate 24 can also be functioned as a saturated charge discharge section which discharges saturated charges to the saturated charge discharging drain 23 by being always supplied with a potential higher than the potential positioned on the most upstream side (the lowest potential position in the charge transferring section 2) as viewed in the charge transfer direction of the photoelectric converter 2.

Figure 7:
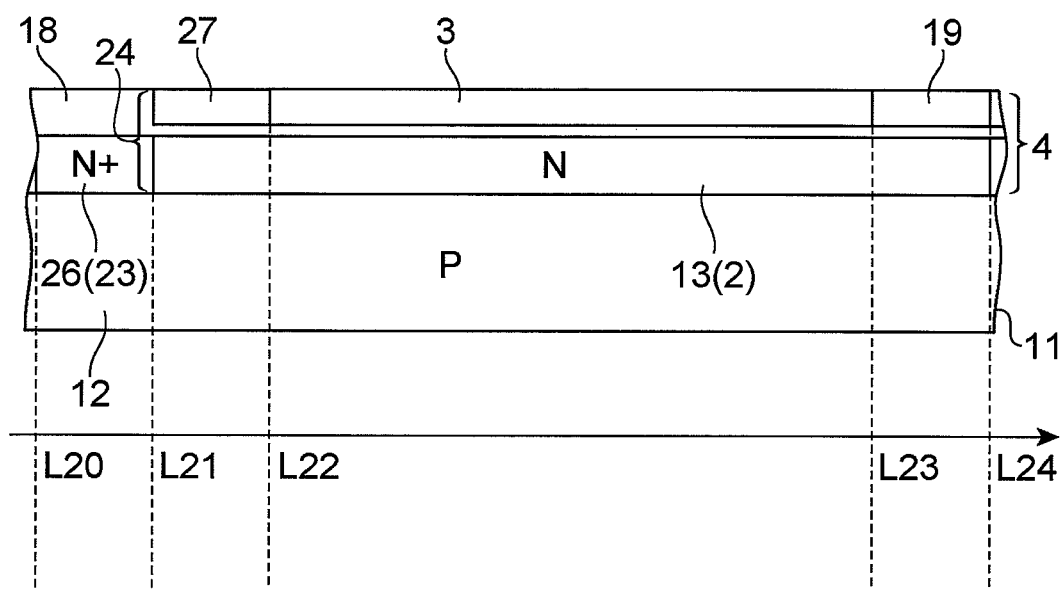
FIG. 7 is a sectional view along the VII-VII line of the solid-state image pickup device of FIG. 6.

FIG. 7 is a sectional view along the arrow VII-VII of the solid-state image pickup device of FIG. 6. FIG. 8 is a diagram showing the level of the potential in the cross-section structure of the solid-state image pickup device of FIG. 7.

As shown in FIG. 7, in the charge transfer direction of the photoelectric converter 2, the semiconductor substrate 11 includes n-type semiconductor layers 13 and n$^+$ type semiconductor layers 26. The n-type semiconductor layer 13 functions as the photoelectric converter 2 and the readout gate 4 as described above. On the surface on the opposite side of the charge transfer direction side of the photoelectric converter 2 (opposite side of the readout gate electrode 19) of the semiconductor substrate 11, a saturated charge discharging gate electrode 27 is provided via an insulating layer 18. The saturated charge discharging gate electrode 27 is provided adjacent to the most upstream side as viewed in the charge transfer direction of the resistive electrode 3 so that the longitudinal direction is in the alignment direction of the photoelectric converter 2. The saturated charge discharging gate electrode 27 and the readout gate electrode 19 are not in electrical contact with each other at all. The saturated charge discharging gate electrode 27 and the n-type semiconductor 13 under the saturated charge discharging gate electrode 27 constitute a saturated charge discharging gate 24. The n$^+$ type semiconductor layer 26 is provided adjacent to the n-type semiconductor layer 13 of the saturated charge discharging gate 24, and functions as the saturated charge discharging drain 23.

Figure 8:
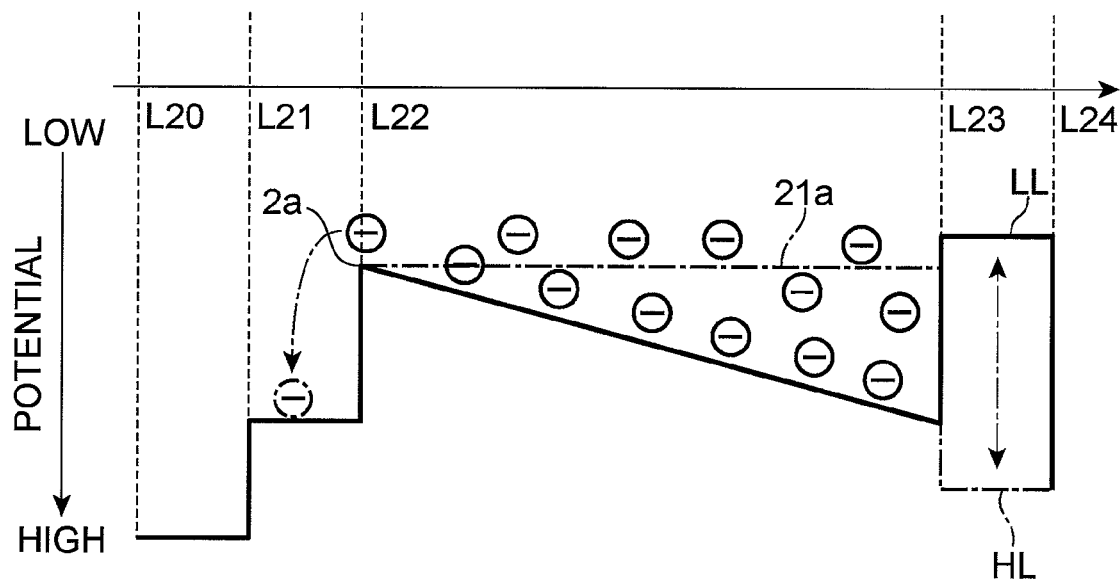
FIG. 8 is a diagram showing the level of the potential in the cross-section structure of the solid-state image pickup device of FIG. 7.

In the potential structure in the charge transfer direction of the photoelectric converter 2, as shown in FIG. 8, the potential of the saturated charge discharging gate 24 is higher than the potential at the most upstream position (the lowest potential position in the charge transferring section 2) as viewed in the charge transfer direction of the photoelectric converter 2.

In FIG. 8, potentials at the positions L20 to L24 corresponding to the respective positions L20 to L24 of FIG. 7 are shown. The potential between the position L23 and the position L24 can selectively have the H level (HL) and the L level (LL) according to the voltage applied to the readout gate electrode 19 as in the case of FIG. 3.

Further, the potential of the saturated charge discharging drain 23 is higher than the potential of the saturated charge discharging gate 24. Accordingly, saturated charges generated in the photoelectric converter 2 flow into the saturated charge discharging drain 23 via the saturated charge discharging gate 24 and can be discharged to the outside.

As shown in FIG. 8, the voltages to be applied to the resistive electrode 3 and the unnecessary charge discharging gate electrode are adjusted so that, among the potentials gradient in the photoelectric converter 2, the level 2a of the lowest potential and the level 21a of the potential barrier of the unnecessary charge discharging gate become substantially equal to each other (the potential level 21a is 100±10% of the potential level 2a). For example, it is allowed that a voltage of −5V is applied to one end (end portion opposite to the charge transfer direction side) of the resistive electrode 3 and a voltage of −5V is applied to the unnecessary charge discharging gate electrode 8 in the same manner.

As described above, according to this solid-state image pickup device 10, even if saturated charges are generated by overexposure or instantaneous incidence of light with a high intensity on the photoelectric converter 2, the saturated charges are discharged by the saturated charge discharging drain 23 via the saturated charge discharging gate 24, so that the blooming phenomenon can be effectively prevented.

Further, according to this solid-state image pickup device 10, the level of the lowest potential of the photoelectric converter 2 and the level of the potential barrier of the unnecessary charge discharging gate 8 are substantially equal to each other, so that when saturated charges are generated, the saturated charges not only exceed the lowest potential of the photoelectric converter 2 and are discharged to the saturated charge discharging drain 23, but also exceed the potential barrier of the unnecessary charge discharging gate 8 and are discharged to the unnecessary charge discharging drain 7. Therefore, even if saturated charges are generated by overexposure or instantaneous incidence of light with a high intensity, the saturated charges can be effectively discharged, so that the blooming phenomenon can be more effectively prevented.

It is also possible that the flow of saturated charges are cut-off by setting the potential of the saturated charge discharging gate 24 to be lower than the potential at the most upstream position (the lowest potential position in the charge transferring section 2) as viewed in the charge transfer direction of the photoelectric converter 2. In this case, at the same time, by adjusting the voltages to be applied to the resistive electrode 3 and the unnecessary charge discharging gate electrode so that the level of the potential of the saturated charge discharging gate 24 and the level 21a of the potential barrier of the unnecessary charge discharging gate become substantially equal to each other (the potential level 21a is 100±10% of the potential level 2a), the flow of saturated charges to the unnecessary charge discharging drain is also cut-off at the same time. Accordingly, the charge amount allowed to be accumulated in the photoelectric converter 2, that is, the saturation level can be raised. In addition, by increasing the charge amount that can be accumulated in the transferring section, the dynamic range can be increased.

INDUSTRIAL APPLICABILITY

The present invention is applicable to a solid-state image pickup device such as a line sensor.

The invention claimed is:

1. A solid-state image pickup device comprising:
   a plurality of photoelectric converters each having a rectangular shape as viewed in an energy beam incident direction,
      the photoelectric converters being aligned in a shorter side direction of the rectangular shape, and
      the photoelectric converters forming a line sensor;
   a plurality of resistive electrodes provided on a surface side of the respective photoelectric converters,
      each of the resistive electrodes receiving a voltage between two ends of the resistive electrode, a direction between the two ends crossing the shorter direction;
   a transferring section which is provided on one side of the photoelectric converters in the direction crossing a predetermined direction, acquires charges generated in the photoelectric converters and transfers the charges in the predetermined direction;
   an unnecessary charge discharging drain which is provided adjacent to the photoelectric converter along the direction crossing the predetermined direction and discharges unnecessary charges generated in the photoelectric converter from the photoelectric converter; and
   an unnecessary charge discharging gate which is provided between the photoelectric converter and the unnecessary charge discharging drain and selectively performs cutting-off and release of the flow of unnecessary charges from the photoelectric converter to the unnecessary charge discharging drain.

2. The solid-state image pickup device according to claim 1, comprising:
   a saturated charge discharging drain which is provided on the other side of the photoelectric converter in the direction crossing the shorter side direction and discharges saturated charges generated in the photoelectric converter from the photoelectric converter; and
   a saturated charge discharging gate which is provided between the photoelectric converter and the saturated charge discharging drain and selectively performs cutting-off and release of the flow of saturated charges from the photoelectric converter to the saturated charge discharging drain.

3. The solid-state image pickup device according to claim 2, wherein the level of the lowest potential of the photoelectric converter and the level of the potential barrier of the unnecessary charge discharging gate are substantially equal to each other.

4. The solid-state image pickup device according to claim 1, wherein the unnecessary charge discharging drain is provided every two regions of the regions between the photoelectric converters adjacent to each other.

5. The solid-state image pickup device according to claim 4, wherein among the regions between the photoelectric converters adjacent to each other, in regions which are not provided with the unnecessary charge discharging drains, isolators are provided.

6. The solid-state image pickup device according to claim 1, wherein one transferring section is provided for each predetermined number of photoelectric converters, so that the number of transferring sections as a whole is a plurality, a drain terminal to be electrically connected to the unnecessary charge discharging drain and a gate terminal to be electrically connected to the unnecessary charge discharging gate are provided for each transferring section.

7. The solid-state image pickup device according to claim 1, comprising:
   a saturated charge discharging drain which is provided on the other side of the photoelectric converter in the direction crossing the predetermined direction and discharges saturated charges generated in the photoelectric converter from the photoelectric converter; and
   a saturated charge discharger which is provided between the photoelectric converter and the saturated charge discharging drain and makes saturated charges flow from the photoelectric converter to the saturated charge discharging drain.

* * * * *

UNITED STATES PATENT AND TRADEMARK OFFICE
CERTIFICATE OF CORRECTION

PATENT NO.       : 8,334,918 B2
APPLICATION NO.  : 12/516411
DATED            : December 18, 2012
INVENTOR(S)      : Shinya Otsuka et al.

It is certified that error appears in the above-identified patent and that said Letters Patent is hereby corrected as shown below:

ON THE COVER PAGE:

At (54) Title:

"SOLID-STATE IMAGING ELEMENT" should read --SOLID-STATE IMAGE PICKUP DEVICE WITH UNNECESSARY CHARGE DISCHARGING DRAIN--.

Signed and Sealed this
Nineteenth Day of March, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,334,918 B2
APPLICATION NO. : 12/516411
DATED : December 18, 2012
INVENTOR(S) : Shinya Otsuka et al.

It is certified that error appears in the above-identified patent and that said Letters Patent is hereby corrected as shown below:

ON THE TITLE PAGE, Item (54) and at Column 1, line 1 in specification,

Title:

"SOLID-STATE IMAGING ELEMENT" should read --SOLID-STATE IMAGE PICKUP DEVICE WITH UNNECESSARY CHARGE DISCHARGING DRAIN--.

This certificate supersedes the Certificate of Correction issued March 19, 2013.

Signed and Sealed this
Ninth Day of April, 2013

Teresa Stanek Rea
*Acting Director of the United States Patent and Trademark Office*